United States Patent
Jeong et al.

(10) Patent No.: US 8,466,465 B2
(45) Date of Patent: Jun. 18, 2013

(54) THIN FILM TRANSISTOR HAVING AN OXIDE SEMICONDUCTOR BILAYER, METHOD OF MANUFACTURING THE SAME AND FLAT PANEL DISPLAY DEVICE HAVING THE SAME

(75) Inventors: Jong-Han Jeong, Suwon-si (KR); Tae-Kyung Ahn, Suwon-si (KR); Jae-Kyeong Jeong, Suwon-si (KR); Jin-Sung Park, Suwon-si (KR); Hun-Jung Lee, Suwon-si (KR); Hyun-Soo Shin, Suwon-si (KR); Yeon-Gon Mo, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 411 days.

(21) Appl. No.: 12/382,743

(22) Filed: Mar. 23, 2009

(65) Prior Publication Data

US 2010/0026169 A1 Feb. 4, 2010

(30) Foreign Application Priority Data

Aug. 4, 2008 (KR) .................. 10-2008-0076010

(51) Int. Cl.
| | |
|---|---|
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/76 | (2006.01) |
| H01L 31/112 | (2006.01) |
| H01L 27/108 | (2006.01) |
| H01L 29/12 | (2006.01) |
| H01L 29/15 | (2006.01) |

(52) U.S. Cl.
USPC .............. 257/59; 257/57; 257/66; 257/69; 257/72; 257/E29.117; 257/E29.137; 257/E29.151; 257/E29.202; 257/E29.273

(58) Field of Classification Search
USPC ............... 257/57, 59, 66, 69, 72, E29.151, 257/E29.117, E29.137, E29.202, E29.273
See application file for complete search history.

(56) References Cited

U.S. PATENT DOCUMENTS

| | | | | |
|---|---|---|---|---|
| 4,633,031 | A | * | 12/1986 | Todorof .................. 136/249 |
| 4,820,024 | A | * | 4/1989 | Nishiura .................. 349/50 |

(Continued)

FOREIGN PATENT DOCUMENTS

| | | |
|---|---|---|
| JP | 2004-273614 | 9/2004 |
| JP | 2007-250982 | 9/2007 |

(Continued)

OTHER PUBLICATIONS

Korean Office Action issued by Korean Patent Office on Feb. 11, 2010 corresponding Korean Patent Application No. 10-2008-0076010 and Request for Entry of the Accompanying Office Action attached herewith.

(Continued)

*Primary Examiner* — Ida M Soward
(74) *Attorney, Agent, or Firm* — Robert E. Bushnell, Esq.

(57) ABSTRACT

Disclosed is a thin film transistor which has an oxide semiconductor as an activation layer, a method of manufacturing the same and a flat panel display device having the same. The thin film transistor includes an oxide semiconductor layer formed on a substrate and including a channel region, a source region and a drain region, a gate electrode insulated from the oxide semiconductor layer by a gate insulating film, and source electrode and drain electrode which are coupled to the source region and the drain region, respectively. The oxide semiconductor layer includes a first layer portion and a second layer portion. The first layer portion has a first thickness and a first carrier concentration, and the second layer portion has a second thickness and a second carrier concentration. The second carrier concentration is lower than the first carrier concentration.

24 Claims, 8 Drawing Sheets

U.S. PATENT DOCUMENTS

| | | | | |
|---|---|---|---|---|
| 5,166,086 A | * | 11/1992 | Takeda et al. | 438/160 |
| 5,327,012 A | * | 7/1994 | Yano et al. | 257/758 |
| 5,334,544 A | * | 8/1994 | Matsuoka et al. | 438/158 |
| 5,349,205 A | * | 9/1994 | Kobayashi et al. | 257/59 |
| 5,480,810 A | * | 1/1996 | Wei et al. | 438/59 |
| 5,600,155 A | * | 2/1997 | Wu | 257/72 |
| 5,661,050 A | * | 8/1997 | den Boer et al. | 438/30 |
| 5,677,211 A | * | 10/1997 | Kaneko | 438/158 |
| 5,936,257 A | * | 8/1999 | Kusunoki et al. | 257/10 |
| 6,197,625 B1 | * | 3/2001 | Choi | 438/158 |
| 6,436,740 B1 | * | 8/2002 | Jen et al. | 438/149 |
| 6,600,524 B1 | * | 7/2003 | Ando et al. | 349/43 |
| 6,933,989 B2 | * | 8/2005 | Oke et al. | 349/43 |
| 7,037,766 B2 | * | 5/2006 | Maeda et al. | 438/149 |
| 7,642,114 B2 | | 1/2010 | Yamaguchi et al. | 438/50 |
| 7,682,882 B2 | * | 3/2010 | Ryu et al. | 438/149 |
| 7,833,851 B2 | * | 11/2010 | Kuwabara et al. | 438/166 |
| 7,923,722 B2 | * | 4/2011 | Ryu et al. | 257/43 |
| 8,143,678 B2 | * | 3/2012 | Kim et al. | 257/404 |
| 8,188,472 B2 | * | 5/2012 | Park et al. | 257/59 |
| 2002/0117719 A1 | * | 8/2002 | Ando et al. | 257/347 |
| 2003/0199129 A1 | * | 10/2003 | Yamazaki et al. | 438/158 |
| 2005/0148143 A1 | * | 7/2005 | Yang et al. | 438/283 |
| 2006/0151788 A1 | * | 7/2006 | Cho et al. | 257/72 |
| 2006/0231882 A1 | | 10/2006 | Kim et al. | 257/310 |
| 2006/0243975 A1 | * | 11/2006 | Kim et al. | 257/59 |
| 2006/0258080 A1 | * | 11/2006 | Takahashi | 438/231 |
| 2007/0019122 A1 | * | 1/2007 | Lee et al. | 349/43 |
| 2007/0131976 A1 | * | 6/2007 | Kanno et al. | 257/223 |
| 2007/0222933 A1 | * | 9/2007 | Ohmi | 349/138 |
| 2008/0044963 A1 | * | 2/2008 | Cho et al. | 438/160 |
| 2008/0105871 A1 | * | 5/2008 | Yan et al. | 257/58 |
| 2008/0206923 A1 | * | 8/2008 | Kim et al. | 438/104 |
| 2008/0258143 A1 | * | 10/2008 | Kim et al. | 257/43 |
| 2008/0283831 A1 | * | 11/2008 | Ryu et al. | 257/43 |
| 2009/0153056 A1 | * | 6/2009 | Chen et al. | 315/51 |
| 2009/0305461 A1 | * | 12/2009 | Akimoto et al. | 438/104 |
| 2010/0085081 A1 | * | 4/2010 | Ofuji et al. | 326/102 |
| 2011/0042669 A1 | * | 2/2011 | Kim et al. | 257/43 |

FOREIGN PATENT DOCUMENTS

| | | |
|---|---|---|
| KR | 10-2007-0031165 | 3/2007 |
| KR | 10-2007-0090182 A | 9/2007 |

OTHER PUBLICATIONS

Korean Office action dated Jul. 26, 2010 for the corresponding Korean priority application No. 10-2008-0076010.

* cited by examiner

THIN FILM TRANSISTOR HAVING AN OXIDE SEMICONDUCTOR BILAYER, METHOD OF MANUFACTURING THE SAME AND FLAT PANEL DISPLAY DEVICE HAVING THE SAME

CLAIM OF PRIORITY

This application makes reference to, incorporates the same herein, and claims all benefits accruing under 35 U.S.C. §119 from an application earlier filed in the Korean Intellectual Property Office on 4 Aug. 2008 and there duly assigned Serial No. 10-2008-0076010.

BACKGROUND OF THE INVENTION

1. Field of the Invention

The present invention relates to a thin film transistor, a method of manufacturing the same and a flat panel display device having the same, and more particularly to a thin film transistor which has an oxide semiconductor as an activation layer, a method of manufacturing the same and a flat panel display device having the same.

2. Description of the Related Art

A thin film transistor generally includes an activation layer which provides a channel region, a source region, and a drain region, and a gate electrode which is formed on the channel region and electrically insulated from the activation layer by a gate insulating film.

The activation layer of the thin film transistor formed as described above is generally formed of a semiconductor material, such as amorphous silicon or poly-silicon. However, if the activation layer of the thin film transistor is formed of amorphous silicon, it is difficult to implement a driving circuit operating at high speed due to low mobility. Meanwhile, if the activation layer is formed of poly-silicon, mobility is high, but a separate compensation circuit should be added due to uneven threshold voltage.

Also, a conventional method of manufacturing a thin film transistor using a low temperature poly-silicon (LTPS) involves an expensive process such as a laser annealing and has difficulty in property control, so it is difficult to be applied to a large-area substrate.

A study using an oxide semiconductor as an activation layer has been recently conducted in order to solve the problems.

Japanese Laid-Open Patent Publication No. 2004-273614 discloses a thin film transistor which has zinc oxide (ZnO) or an oxide semiconductor having zinc oxide (ZnO) as a main ingredient, as an activation layer.

The compound semiconductor having zinc oxide (ZnO) as a main ingredient is evaluated as a stable material, having an amorphous shape. If such a compound semiconductor is used as an activation layer, the compound semiconductor has various advantages in that the thin film transistor may be manufactured at a low temperature below 350° C. using the existing processing equipment, without additionally buying separate processing equipments, and an ion implantation process may be omitted.

However, there is a need for the development of process and the improvement of property capable of satisfying the electrical property in order to apply the oxide semiconductor to the device.

SUMMARY OF THE INVENTION

One of objects of the present invention is to provide a thin film transistor which can maintain stable semiconductor property of an oxide semiconductor layer, a method of manufacturing the same, and a flat panel display device having the same.

In order to accomplish the above object, according to one aspect of the present invention, there is provided a thin film transistor including a substrate; an oxide semiconductor layer formed on the substrate and including a channel region, a source region and a drain region; a gate electrode insulated from the oxide semiconductor layer by a gate insulating film; and source electrode and drain electrode which are coupled to the source region and the drain region, respectively. The oxide semiconductor layer includes a first layer portion and a second layer portion. The first layer portion has a first thickness and a first carrier concentration, and the second layer portion has a second thickness and a second carrier concentration. The second carrier concentration is lower than the first carrier concentration.

In order to accomplish the above object, according to another aspect of the present invention, there is provided a method of manufacturing a thin film transistor, including forming a gate electrode on a substrate; forming a gate insulating film on the gate electrode; forming an oxide semiconductor layer on the gate insulating film; and forming a source electrode; and forming a drain electrode. The oxide semiconductor layer includes a channel region, a source region, and a drain region, the step of forming the oxide semiconductor layer comprising depositing a first layer portion having a first thickness and a first carrier concentration; and depositing a second layer portion having a second thickness and a second carrier concentration. The second carrier concentration is lower than the first carrier concentration. The source electrode is formed to be coupled to the source region, and the drain is formed to be coupled to the drain region.

In order to accomplish the above object, according to another aspect of the present invention, there is provided a flat panel display device, including a first substrate; a second substrate including a second electrode; and a liquid crystal layer disposed between the first electrode and second electrode. The first substrate includes a first conductive line, a second conductive line, a thin film transistors coupled to the first conductive line and the second conductive line, and a first electrode coupled to the thin film transistor. Signals supplied to the first electrode are controlled by the thin film transistor. The thin film transistor of the first substrate includes an oxide semiconductor layer formed on the substrate and including a channel region, a source region and a drain region; a gate electrode insulated from the oxide semiconductor layer by a gate insulating film; a source electrode coupled to the source region; and a drain electrode coupled to the drain region. The oxide semiconductor layer includes a first layer portion and a second layer portion. The first layer portion has a first thickness and a first carrier concentration, and the second layer portion has a second thickness and a second carrier concentration. The second carrier concentration is lower than the first carrier concentration.

In order to accomplish the above object, according to another aspect of the present invention, there is provided a flat panel display device, including a first substrate; and a second substrate disposed facing the first substrate. The first substrate includes an organic light emitting device including a first electrode, an organic thin film layer, and a second electrode, and a thin film transistor coupled to the organic light emitting device to control an operation of the organic light emitting device. The thin film transistor of the first substrate includes an oxide semiconductor layer formed on the substrate and including a channel region, a source region and a drain region; a gate electrode insulated from the oxide semiconductor layer by a gate insulating film; a source electrode coupled to the source region; and a drain electrode coupled to the drain region. The oxide semiconductor layer includes a first layer portion and a second layer portion. The first layer portion has a first thickness and a first carrier concentration, and the second layer portion has a second thickness and a second carrier concentration. The second carrier concentration is lower than the first carrier concentration.

The present invention controls a carrier concentration on an upper layer portion to be lower than that on a lower layer portion by controlling an oxygen partial pressure when an oxide semiconductor layer used as an activation layer of a thin film transistor is formed. By controlling the carrier concentration on the upper layer portion to be lower than that on the lower layer portion in preparation for the change in the carrier concentration, the present invention can maintain the carrier concentration above a predetermined level that can maintain the semiconductor property, even if the carrier concentration is increased by plasma damage while forming a passivation layer for protecting the thin film transistor. The present invention does not add a separate process for preventing the property of the oxide semiconductor layer from being changed and applies an existing process for forming the passivation layer as it is, thereby making it possible to improve the compatibility of processes and equipments and prevent increase in manufacturing costs.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on another element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, exemplary embodiments according to the present invention will be described with reference to the accompanying drawings so that those skilled in the art to which the present invention pertains can easily carry out the present invention. However, the present invention may be modified in many different forms and it should not be limited to the embodiments set forth herein.

Figure 1:
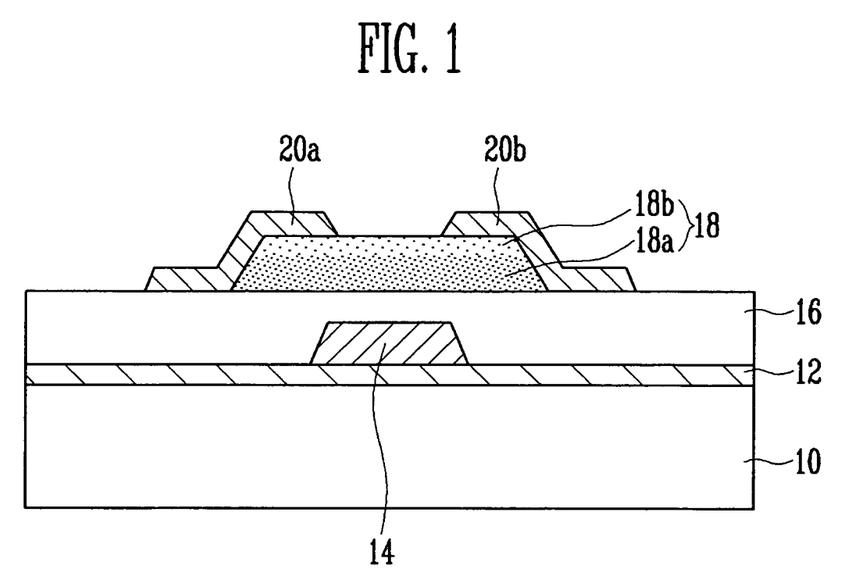
FIG. 1 is a cross-sectional view for explaining an example of a thin film transistor according to the present invention.

FIG. 1 is a cross-sectional view for explaining an example of a thin film transistor according to the present invention.

A buffer layer 12 is formed on a substrate 10 made of an insulating material, and a gate electrode 14 is formed on the buffer layer 12. An oxide semiconductor layer 18, which is insulated from the gate electrode 14 by a gate insulating film 16 and provides a channel region, a source region, and a drain region, is formed on an upper layer portion of the gate insulating film 16 that covers the gate electrode 14.

The oxide semiconductor layer 18 has zinc oxide (ZnO) as a main ingredient and is formed of a GaInZnO (GIZO) layer doped with ion of gallium (Ga) or ion of indium (In), or both of them. At this time, the GIZO layer includes a lower layer portion 18a (or a first layer portion) having a carrier concentration of about $1\times10^5$ $1/cm^3$ to $1\times10^{17}$ $1/cm^3$, and an upper layer portion 18b (or a second layer portion) having a carrier concentration lower than that of the lower layer portion 18a. Herein, the unit of carrier concentration ($1/cm^3$) represents number per cubic centimeters. For example, a carrier concentration of the upper layer portion 18b can be about $1\times10^{12}$ $1/cm^3$ to $1\times10^{15}$ $1/cm^3$. In other words, the lower layer portion 18a having a predetermined first thickness from an interface contacting the gate insulating film 16 has a first carrier concentration of $1\times10^{15}$ $1/cm^3$ to $1\times10^{17}$ $1/cm^3$, and the upper layer portion 18b having a remaining second thickness has a second carrier concentration of about $1\times10^{12}$ $1/cm^3$ to $1\times10^{15}$ $1/cm^3$. The lower layer portion 18a, which is a portion where a channel is formed, has a first thickness of 5 nm to 30 nm from the interface contacting the gate insulating film 16, more preferably, a thickness of 5 nm to 10 nm.

Figure 2A:
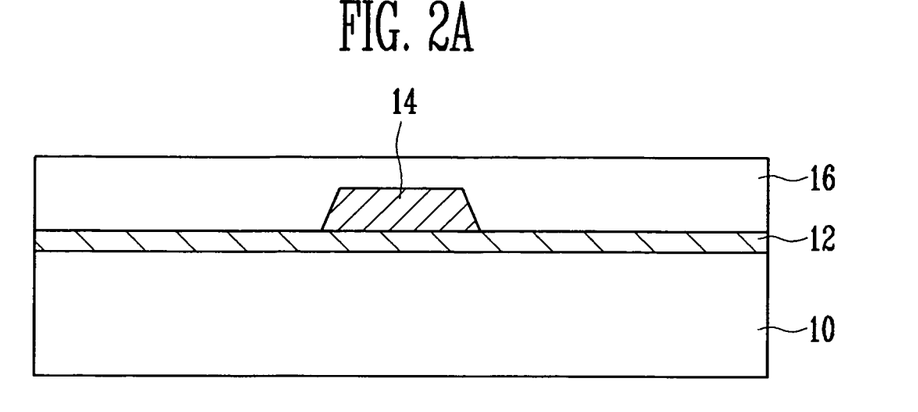
FIGS. 2A to 2C are cross-sectional views for explaining a method of manufacturing a thin film transistor according to the present invention.
Figure 2B:
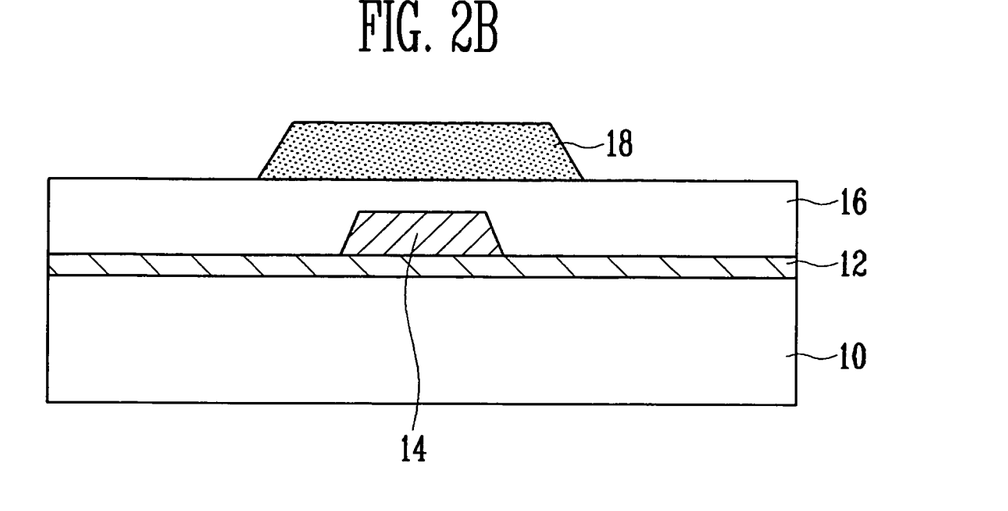
Figure 2C:
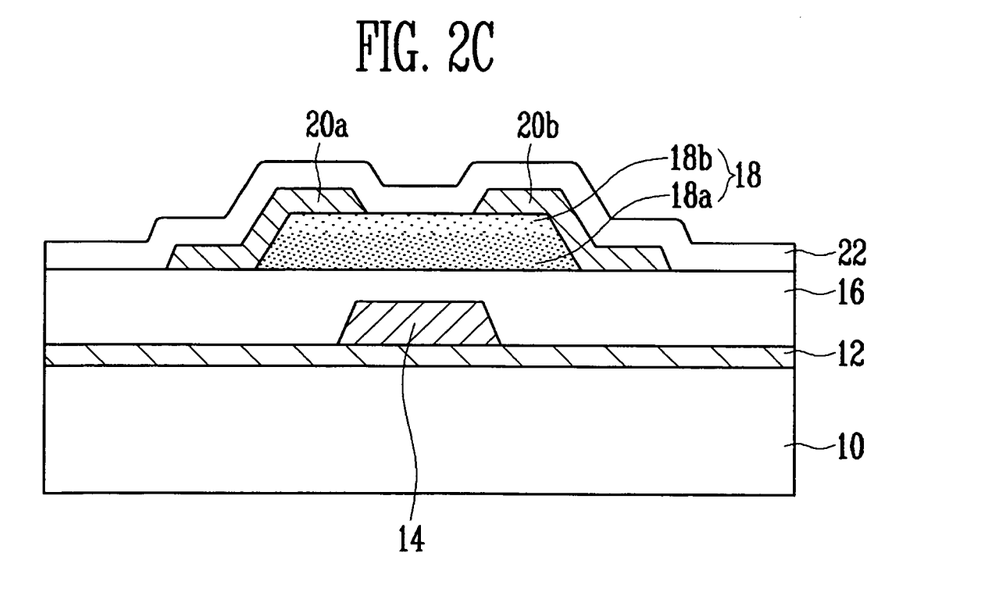

FIGS. 2A to 2C are cross-sectional views for explaining a method of manufacturing a thin film transistor according to the present invention. The thin film transistor according to the present invention will be described in more detail through a manufacturing process of the thin film transistor.

Referring to FIG. 2A, after a buffer layer 12 is formed on a substrate 10 made of an insulating material, a gate electrode 14 is formed on the buffer layer 12 and a gate insulating film 16 is formed on an upper portion covering the gate electrode 14. The gate electrode 14 are made of metal such as Mo, MoW, Al, and the like, and the gate insulating film 16 is made of a silicon dioxide ($SiO_2$) or a silicon nitride (SiNx).

Referring to FIG. 2B, an oxide semiconductor layer 18 including a channel region, a source region, and a drain region, is formed on an upper portion of the gate insulating film 16 in order to overlap with the gate electrode 14. The oxide semiconductor layer 18 has zinc oxide (ZnO) as a main ingredient and is formed of a GaInZnO (GIZO) layer doped with ion of gallium (Ga) or ion of indium (In).

When forming the GaInZnO (GIZO) layer according to the present invention, a carrier concentration of a lower layer portion 18a is controlled to $1\times10^{15}$ $1/cm^3$ to $1\times10^{17}$ $1/cm^3$, and a carrier concentration of an upper layer portion 18b is controlled to be lower than the carrier concentration of the lower layer portion 18a. For example, the carrier concentration of the upper layer portion 18b can be about $1\times10^2$ 1/cm$^3$ to $1\times10^{15}$ 1/cm$^3$. The lower layer portion 18a, which is a portion where a channel is formed, has a thickness of 5 nm to 30 nm from the interface contacting the gate insulating film 16, more preferably, a thickness of 5 nm to 10 nm.

A method for forming the GIZO layer may include a co-sputtering method using two or more targets, such as GaInZnO, InZno and Ga$_2$O$_3$, or a pulse laser deposition method.

The carrier concentration may be controlled by a specific gravity occupied by oxygen, that is, an oxygen partial pressure. For example, if the oxygen partial pressure is controlled to the range of 30 to 90%, the carrier concentration may be controlled optionally within the range of $1\times10^{12}$ 1/cm$^3$ to $1\times10^{15}$ 1/cm$^3$.

If the oxygen partial pressure is increased, oxygen element content within a thin film is increased by reactive sputtering, so one oxygen element is coupled with two electrons within the thin film, thereby reducing the carrier concentration. The GIZO layer is an N type oxide semiconductor, wherein electrons become carriers.

The oxygen concentration difference between the lower layer portion 18a and the upper layer portion 18b according to the control in the oxygen partial pressure may be checked by the Rutherford Backscattering Spectrometry (RBS) analysis or the like.

In case of the GIZO layer, if the carrier concentration is controlled by the oxygen partial pressure, the semiconductor property may be changed into the quasi-conductor property and the carrier concentration may be changed according to the depth (thickness). However, the content ratio of positive ions may not be changed.

The lower layer portion 18a of the GIZO layer constituted as above has specific resistance about $1\times10^2$ to $1\times10^4$ $\Omega\cdot$cm, and the upper layer portion 18b thereof has specific resistance about $1\times10^4$ to $1\times10^6$ $\Omega\cdot$cm that is higher than the specific resistance.

Referring to FIG. 2C, a semiconductor layer made of metal such as MO, MoW, Al, AlAd, or AlLiLa is formed and patterned over an upper surface to form source and drain electrodes 20a and 20b so as to contact source region and drain region, and a passivation layer 22 is formed on the source and drain electrodes 20a and 20b. At this time, if the passivation layer 22 is formed using a physical vapor deposition (PVD) method, an oxide semiconductor layer 18 between the source and drain electrodes 20a and 20b may be exposed to plasma. If the upper layer portion 18b of the oxide semiconductor layer 18 is damaged by plasma, oxygen deficiency is generated due to breakage of surface gratings and the carrier concentration is increased by the oxygen deficiency.

At this time, assuming that both the lower layer portion 18a and upper layer portion 18b of the oxide semiconductor layer 18 have a concentration about $1\times10^{15}$ 1/cm$^3$ to $1\times10^{17}$ 1/cm$^3$, the oxygen concentration of the upper layer portion 18b is reduced due to the plasma damage during the process of forming the passivation layer 22 so that the carrier concentration is more increased. If the carrier concentration is increased to $1\times10^{17}$ 1/cm$^3$ or more, the oxide semiconductor layer 18 has the conductive property due to the reduction in specific resistance and thus fails to maintain the semiconductor property.

However, the present invention controls the carrier concentration of the upper layer portion 18b to be lower than the lower layer portion 18a, making it possible to maintain the carrier concentration (below $1\times10^{17}$ 1/cm$^3$) such that the oxide semiconductor layer may have semiconductor property even if the carrier concentration is increased due to the plasma damage during the process of forming the passivation layer 22.

Figure 3A:
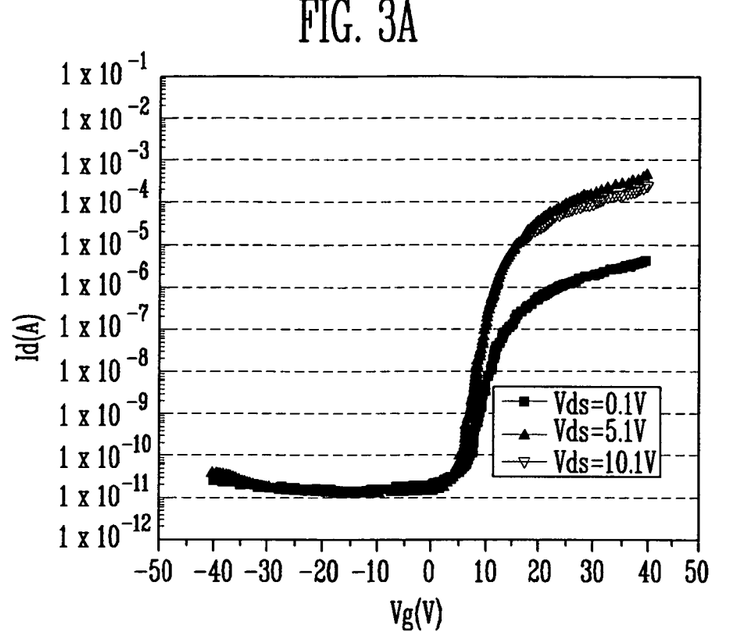
FIGS. 3A and 3B are graphs showing the electrical property of an oxide semiconductor layer formed by controlling an oxygen partial pressure to 5%.
Figure 3B:
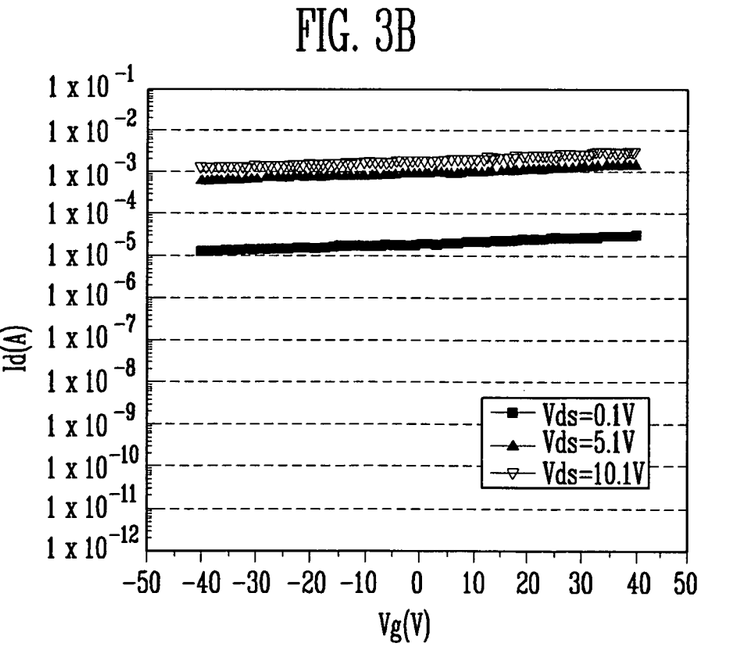
Figure 4A:
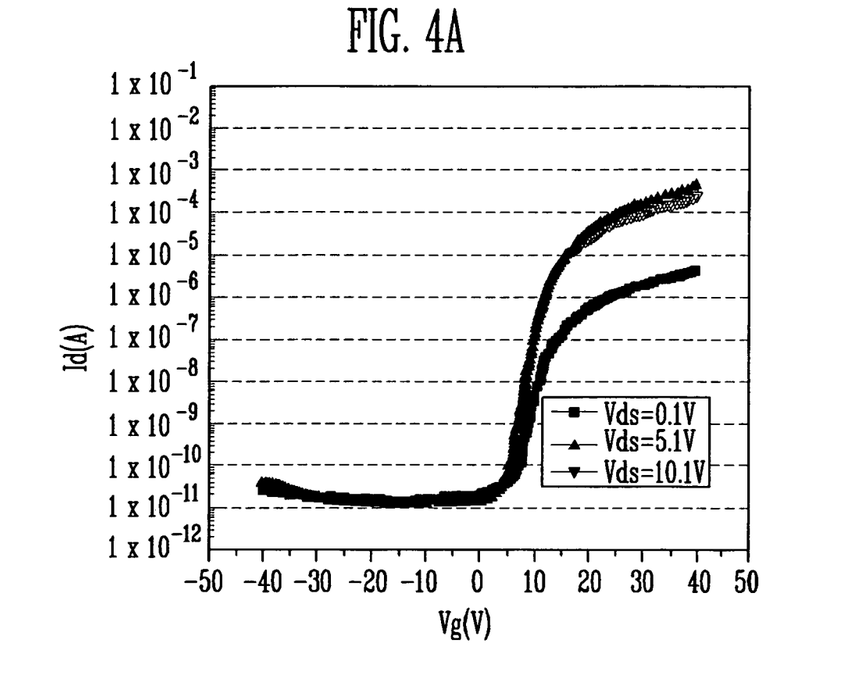
FIGS. 4A and 4B are graphs showing the electrical property of an oxide semiconductor layer formed by controlling an oxygen partial pressure to 35%.
Figure 4B:
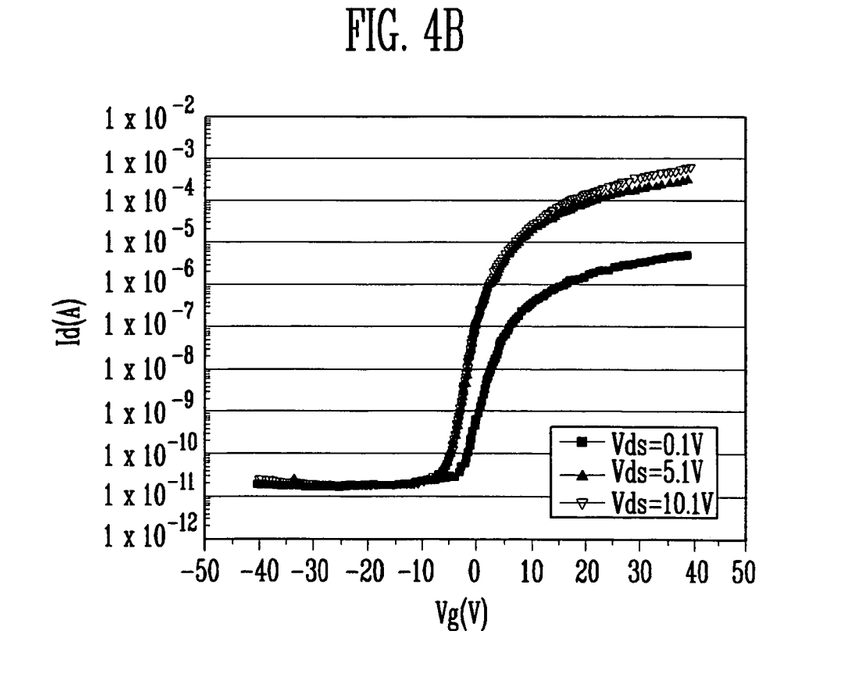

FIGS. 3A and 4A are graphs showing the changes in drain current as a function of gate voltage when a GIZO layer is formed by controlling an oxygen partial pressure to 5% and a GIZO layer is formed by controlling an oxygen partial pressure to 35%, respectively. FIGS. 3B and 4B are graphs showing changes in drain current as a function of gate voltage after a passivation layer 22 is formed.

Referring to FIGS. 3A and 3B, when the oxygen partial pressure is controlled to 5%, relatively excellent mobility and on current properties are shown before the passivation layer is formed (See FIG. 3A), however leakage current properties are shown by the reduction in specific resistance due to plasma damage after the passivation layer is formed (See FIG. 3B).

However, when the oxygen partial pressure is controlled to 35% according to the present invention, as shown in FIGS. 4A and 4B, the mobility and current properties are maintained almost the same before and after the passivation layer is formed.

The thin film transistor of the present invention may be applied to a flat panel display device such as a liquid crystal display device or an organic light emitting display device.

Figure 5:
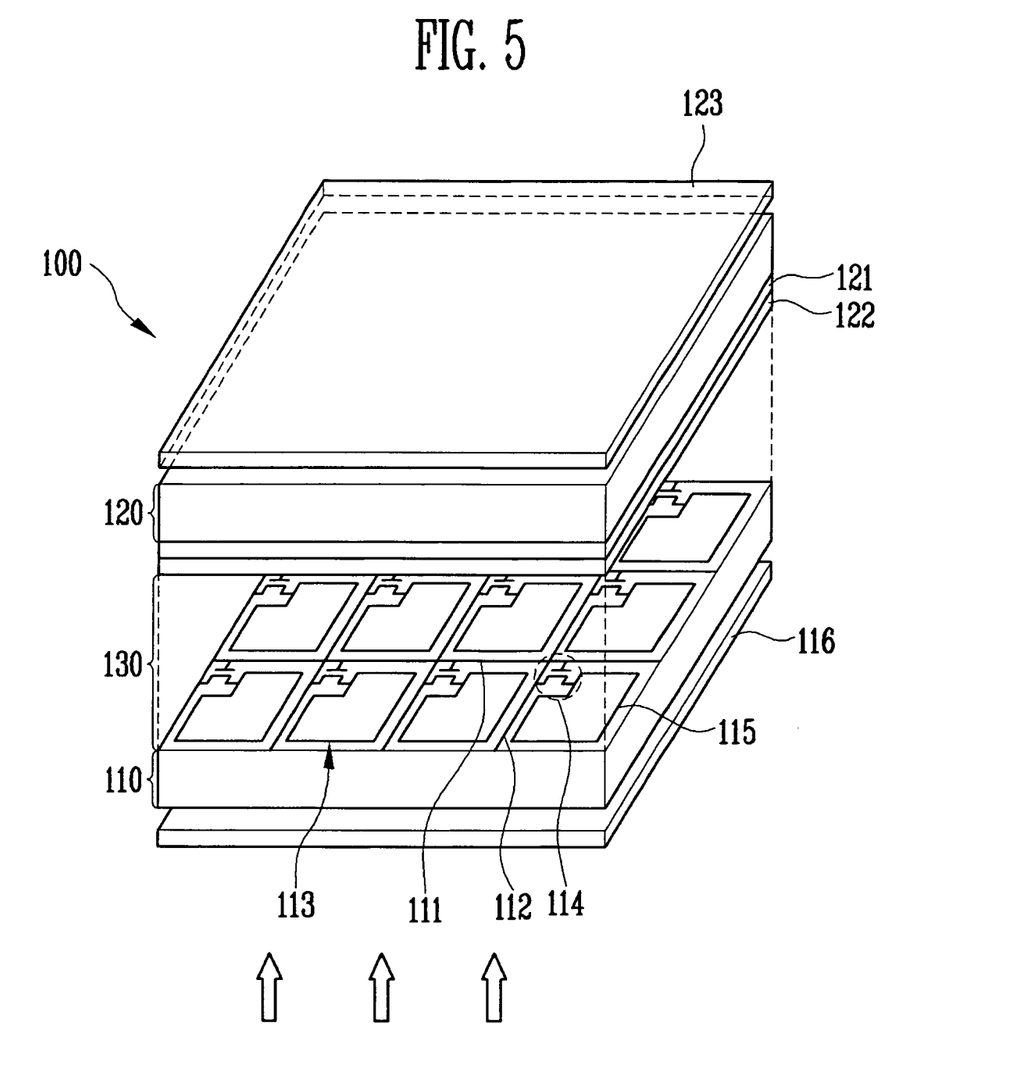
FIG. 5 is a perspective view for explaining an embodiment of a flat panel display device having a thin film transistor according to the present invention.

FIG. 5 is a plan view for explaining an embodiment of a flat panel display device having a thin film transistor according to the present invention, wherein the flat panel display device will be schematically explained based on a display panel 100 which displays an image.

The display panel 100 includes a first substrate 110 and a second substrate 120 disposed to face each other, and a liquid crystal layer 130 interposed between the first and second substrates 110 and 120, wherein a pixel region 113 is defined by a plurality of gate lines 111 and data lines 112 arranged on the substrate 110 in a matrix type. The gate lines 111 and the data lines 112 can be referred to as a first conductive line and second conductive lines, respectively, and vice versa. A thin film transistor 114 which controls signals to be supplied to each pixel and a pixel electrode 115 (or a first electrode) connected to the thin film transistor 114 are formed on a part of the substrate 110, where the gate lines 111 intersect with the data lines 112.

The thin film transistor 114, which has the structure of FIG. 1, may be manufactured according to the manufacturing method of the present invention with reference to FIGS. 2A to 2C.

Also, a color filter 121 and a common electrode 122 (or a second electrode) are formed on the substrate 120. Further, a first polarizing plate 116 and a second polarizing plate 123 are formed on outer surfaces of the substrates 110 and 120, respectively, and a backlight (not shown) is disposed behind the polarizing plate 116 as a light source.

Meanwhile, a driver LCD Drive IC (not shown) which drives the display panel 100 is mounted in a peripheral of a pixel region 113 of the display panel 100. The driver converts electrical signals provided from the external into scan signals and data signals to supply them to the gate lines 111 and the data lines 112.

Figure 6A:
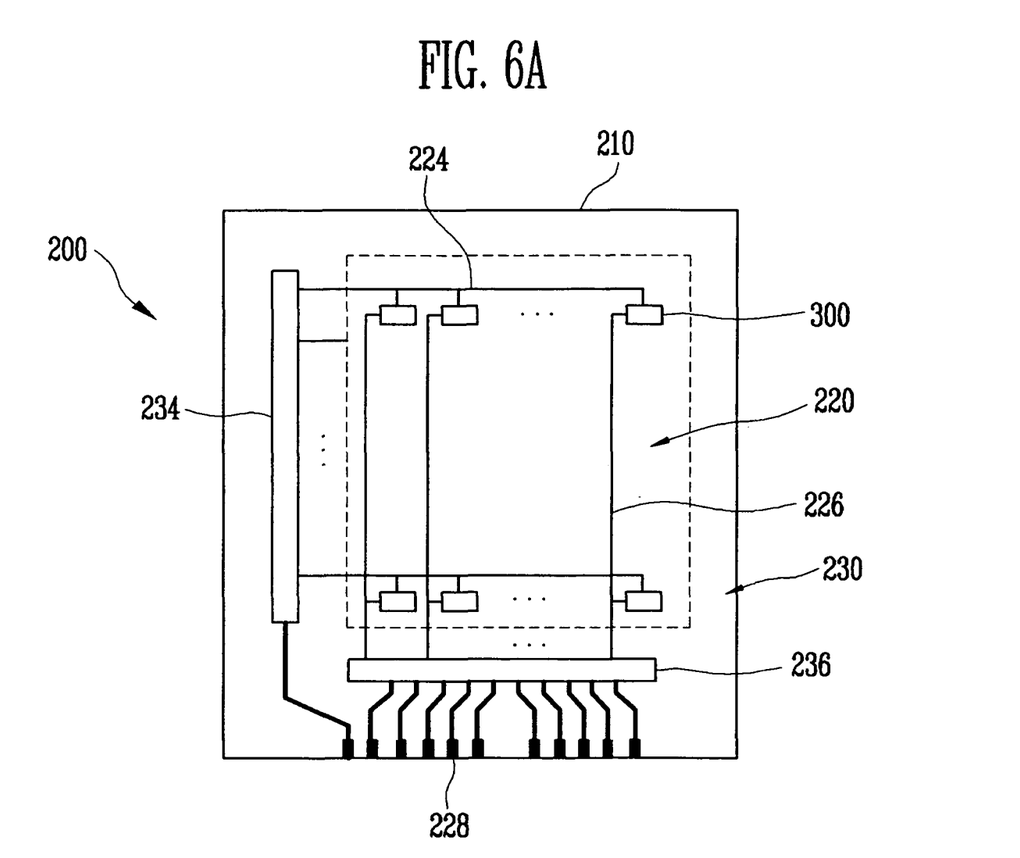
FIGS. 6A and 6B are a plan view and a cross-sectional view for explaining another embodiment of a flat panel display device having a thin film transistor according to the present invention.
Figure 6B:
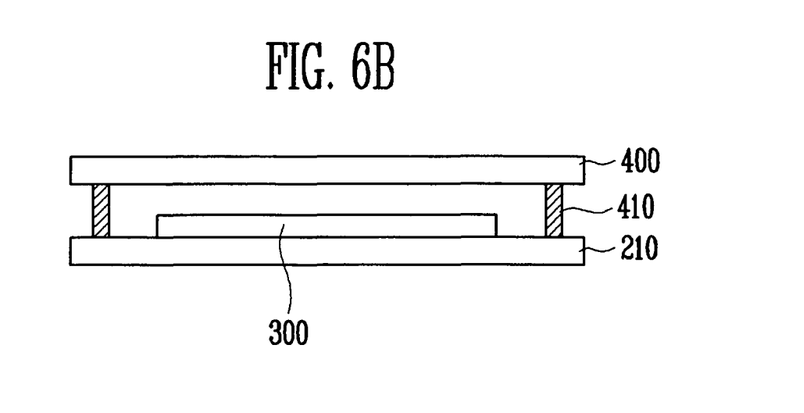

FIGS. 6A and 6B are a plan view and a cross-sectional view for explaining another embodiment of a flat panel display device having a thin film transistor according to the present invention, wherein the flat panel display device will be schematically explained based on a display panel 200 which displays an image.

Referring to FIG. 6A, a substrate 210 includes a pixel region 220 and a non-pixel region 230 surrounding the pixel region 220. In the pixel region 220 on the substrate 210 are formed a plurality of organic light emitting devices 300 coupled between scan lines 224 and data lines 226 in a matrix type. In the non-pixel region 230 on the substrate are formed the scan lines 224 and data lines 226 extending from the scan lines 224 and data lines 226 in the pixel region, power supply lines (not shown) to operate the organic light emitting device 300, and a scan driver 234 and a data driver 236 which process signals provided from the external to supply them to the scan lines 224 and the data lines 226.

Figure 7:
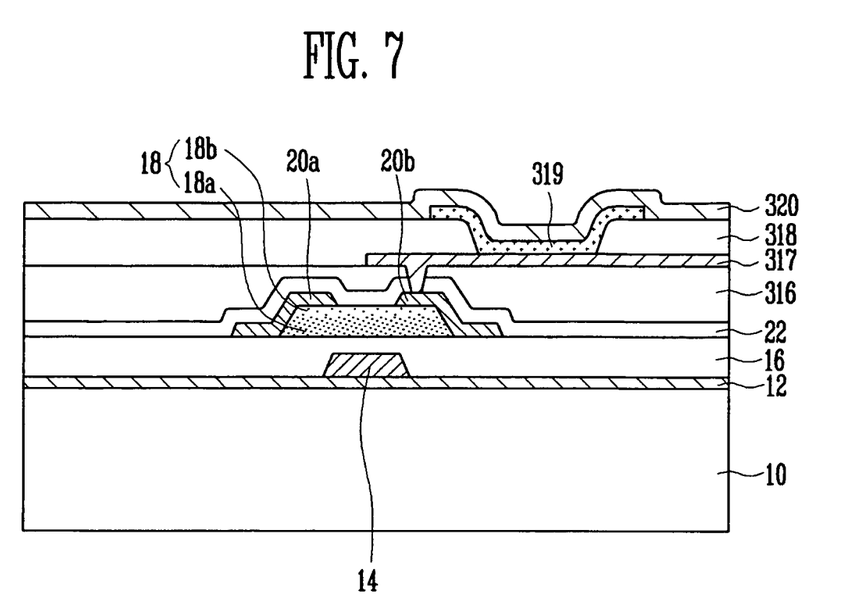
FIG. 7 is a cross-sectional view for explaining an organic light emitting device of FIG. 6A.

Referring to FIG. 7, the organic light emitting device 300 includes an anode electrode 317, a cathode electrode 320, and an organic thin film layer 319 formed between the anode electrode 317 and the cathode electrode 320. The organic thin film layer 319 emits light when activated, and is formed in a structure in which a hole transport layer, an organic light emitting layer, and an electron transport layer are stacked, and a hole injection layer and an electron injection layer may further be included. The organic light emitting device 300 may further include a thin film transistor which controls the operation of the organic light emitting device 300 and a capacitor which maintains signals.

The thin film transistor has the structure of FIG. 1 and may be manufactured according to the manufacturing method of the present invention with reference to FIGS. 2A to 2C.

The organic light emitting device 300 including the thin film transistor constituted as above will be described in more detail with reference to FIGS. 6A and 7.

A buffer layer 12 is formed on a substrate 10, and a gate electrode 14 is formed on the buffer layer 12 in a pixel region 220. At this time, scan lines 224 coupled to a gate electrode 14 may be formed in the pixel region 220, and the scan lines 224 extending from the scan lines 224 in the pixel region 220 and pads 228 to receive signals from the external may be formed in a non-pixel region 230.

An oxide semiconductor layer 18, which is insulated from the gate electrode 14 by a gate insulating film 16 and provides a channel region, a source region, and a drain region, is formed on an upper portion including the gate electrode 14.

The oxide semiconductor layer 18 has zinc oxide (ZnO) as a main ingredient and is formed of a GaInZnO (GIZO) layer doped with ion of gallium (Ga) or ion indium (In). At this time, the GIZO layer includes a lower layer portion 18a having a carrier concentration of about $1\times10^{15}$ 1/cm$^3$ to $1\times10^{17}$ 1/cm$^3$, and an upper layer portion 18b having a carrier concentration lower than that of the lower layer portion 18a, for example, a carrier concentration of about $1\times10^{12}$ 1/cm$^3$ to $1\times10^{15}$ 1/cm$^3$.

Source and drain electrodes 20a and 20b are formed so as to be coupled to the source and drain regions. At this time, the data lines 226 coupled to the source and drain electrodes 20a and 20b are formed in the pixel region 220, and the data lines 226 extending from the data lines 226 in the pixel region 220 and the pads 228 to receive signals from the external are formed in the non-pixel region 230.

A passivation layer 22 is formed on the upper portion including the source and drain electrodes 20a and 20b, and a planarization layer 316 is formed on the passivation layer 22 so as to planarize the surface of the upper portion. A via hole is formed on the planarization layer 316 and the passivation layer 22 in order that the source or drain electrode 20a or 20b is exposed, and an anode electrode 317 coupled to the source or drain electrode 20a or 20b through the via hole is formed.

A pixel definition film 318 is formed on the planarization layer 316 in order that a partial region (light-emitting region) of the anode electrode 317 is exposed, an organic thin film layer 319 is formed on the exposed anode electrode 317, and a cathode electrode 320 is formed on the pixel definition film 318 including the organic thin film layer 319.

Referring to FIG. 6B, a sealing substrate 400 which seals the pixel region 220 is disposed on the upper portion of the substrate 210 formed with the organic light emitting device 300, and the sealing substrate 400 is bonded to the substrate 210 by sealant 410, thereby completing a display panel 200.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor, comprising:
   a substrate;
   an oxide semiconductor layer formed on the substrate and including a channel region, a source region and a drain region, the oxide semiconductor layer including a first layer portion and a second layer portion, the first layer portion having a first thickness and a first carrier concentration, the second layer portion having a second thickness and a second carrier concentration, each of the first carrier and the second carrier including an electron, the first layer and the second layer being made of the same material, the second carrier concentration being lower than the first carrier concentration;
   a gate electrode insulated from the oxide semiconductor layer by a gate insulating film;
   a source electrode coupled to the source region; and
   a drain electrode coupled to the drain region.

2. The thin film transistor as claimed in claim 1, wherein the oxide semiconductor layer includes zinc oxide (ZnO).

3. The thin film transistor as claimed in claim 2, wherein the oxide semiconductor layer is doped with ions of gallium (Ga) or ions of indium (In).

4. The thin film transistor as claimed in claim 1, wherein the first thickness is 5 nm to 30 nm from the interface contacting the gate insulating film.

5. The thin film transistor as claimed in claim 1, wherein the first carrier concentration is $1\times10^{15}$ 1/cm$^3$ to $1\times10^{17}$ 1/cm$^3$, and the second carrier concentration is $1\times10^{12}$ 1/cm$^3$ to $1\times10^{15}$ 1/cm$^3$.

6. The thin film transistor as claimed in claim 1, further comprising a passivation layer formed on the source electrode and the drain electrode.

7. A method of manufacturing a thin film transistor, comprising:
   forming a gate electrode on a substrate;
   forming a gate insulating film on the gate electrode;
   forming an oxide semiconductor layer on the gate insulating film, the oxide semiconductor layer insulated from the gate electrode by the gate insulating film, the oxide semiconductor layer including a channel region, a source region, and a drain region, the step of forming the oxide semiconductor layer comprising:
      depositing a first layer portion having a first thickness and a first carrier concentration, the first carrier including an electron; and
      depositing a second layer portion having a second thickness and a second carrier concentration, the second carrier including an electron, the first layer and the second layer being made of the same material, the second carrier concentration being lower than the first carrier concentration;

forming a source electrode to be coupled to the source region; and forming a drain electrode to be coupled to the drain region.

8. The method of manufacturing the thin film transistor as claimed in claim 7, the oxide semiconductor layer includes zinc oxide (ZnO).

9. The method of manufacturing the thin film transistor as claimed in claim 8, wherein the oxide semiconductor layer is doped with ions of gallium (Ga) or ions of indium (In).

10. The method of manufacturing the thin film transistor as claimed in claim 7, wherein the first thickness is 5 nm to 30 nm from the interface contacting the gate insulating film.

11. The method of manufacturing the thin film transistor as claimed in claim 7, wherein the first carrier concentration is $1 \times 10^{15}$ 1/cm$^3$ to $1 \times 10^{17}$ 1/cm$^3$, and the second carrier concentration is $1 \times 10^{12}$ 1/cm$^3$ to $1 \times 10^{15}$ 1/cm$^3$.

12. The method of manufacturing the thin film transistor as claimed in claim 7, wherein the first carrier concentration and the second carrier concentration are controlled by an oxygen partial pressure.

13. The method of manufacturing the thin film transistor as claimed in claim 12, wherein the oxygen partial pressure is controlled in the range of 30% to 90%.

14. The method of manufacturing the thin film transistor as claimed in claim 7, further comprising forming a passivation layer on the source electrode and drain electrode.

15. A flat panel display device, comprising:
a first substrate comprising:
   a first conductive line;
   a second conductive line;
   a thin film transistors coupled to the first conductive line and the second conductive line; and
   a first electrode coupled to the thin film transistor, signals supplied to the first electrode being controlled by the thin film transistor;
a second substrate including a second electrode; and
a liquid crystal layer disposed between the first electrode and second electrode, the thin film transistor of the first substrate comprising:
   a substrate;
   an oxide semiconductor layer formed on the substrate and including a channel region, a source region and a drain region, the oxide semiconductor layer including a first layer portion and a second layer portion, the first layer portion having a first thickness and a first carrier concentration, the second layer portion having a second thickness and a second carrier concentration, each of the first carrier and the second carrier including an electron, the first layer and the second layer being made of the same material, the second carrier concentration being lower than the first carrier concentration;
   a gate electrode insulated from the oxide semiconductor layer by a gate insulating film;
   a source electrode coupled to the source region; and
   a drain electrode coupled to the drain region.

16. The flat panel display device of claim 15, wherein the oxide semiconductor layer includes zinc oxide (ZnO).

17. The flat panel display device of claim 16, wherein the oxide semiconductor layer is doped with ions of gallium (Ga) or ions of indium (In).

18. The flat panel display device of claim 15, wherein the first thickness is 5 nm to 30 nm from the interface contacting the gate insulating film.

19. The flat panel display device of claim 15, wherein the first carrier concentration is $1 \times 10^{15}$ 1/cm$^3$ to $1 \times 10^{17}$ 1/cm$^3$, and the second carrier concentration is $1 \times 10^{12}$ 1/cm$^3$ to $1 \times 10^{15}$ 1/cm$^3$.

20. A flat panel display device, comprising:
a first substrate comprising:
   an organic light emitting device including a first electrode, an organic thin film layer, and a second electrode; and
   a thin film transistor coupled to the organic light emitting device to control an operation of the organic light emitting device; and
a second substrate disposed facing the first substrate, the thin film transistor of the first substrate comprising:
   a substrate;
   an oxide semiconductor layer formed on the substrate and including a channel region, a source region and a drain region, the oxide semiconductor layer including a first layer portion and a second layer portion, the first layer portion having a first thickness and a first carrier concentration, the second layer portion having a second thickness and a second carrier concentration, each of the first carrier and the second carrier including an electron, the first layer and the second layer being made of the same material, the second carrier concentration being lower than the first carrier concentration;
   a gate electrode insulated from the oxide semiconductor layer by a gate insulating film;
   a source electrode coupled to the source region; and
   a drain electrode coupled to the drain region.

21. The flat panel display device of claim 20, wherein the oxide semiconductor layer includes zinc oxide (ZnO).

22. The flat panel display device of claim 21, wherein the oxide semiconductor layer is doped with ions of gallium (Ga) or ions of indium (In).

23. The flat panel display device of claim 20, wherein the first thickness is 5 nm to 30 nm from the interface contacting the gate insulating film.

24. The flat panel display device of claim 20, wherein the first carrier concentration is $1 \times 10^{15}$ 1/cm$^3$ to $1 \times 10^{17}$ 1/cm$^3$, and the second carrier concentration is $1 \times 10^{12}$ 1/cm$^3$ to $1 \times 10^{15}$ 1/cm$^3$.

* * * * *